United States Patent
Fan et al.

(10) Patent No.: US 9,368,590 B2
(45) Date of Patent: *Jun. 14, 2016

(54) SILICON-ON-INSULATOR TRANSISTOR WITH SELF-ALIGNED BORDERLESS SOURCE/DRAIN CONTACTS

(71) Applicant: GLOBALFOUNDRIES INC., Grand Cayman (KY)

(72) Inventors: Susan S. Fan, Cohoes, NY (US); Balasubramanian S. Haran, Watervliet, NY (US); David V. Horak, Essex Junction, VT (US); Charles W. Koburger, Delmar, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 132 days.

This patent is subject to a terminal disclaimer.

(21) Appl. No.: 14/073,581

(22) Filed: Nov. 6, 2013

(65) Prior Publication Data

US 2014/0061799 A1    Mar. 6, 2014

Related U.S. Application Data

(63) Continuation of application No. 13/617,866, filed on Sep. 14, 2012, now Pat. No. 8,623,730, which is a continuation of application No. 13/345,201, filed on Jan. 6, 2012, now abandoned.

(51) Int. Cl.
*H01L 21/28* (2006.01)
*H01L 21/70* (2006.01)
(Continued)

(52) U.S. Cl.
CPC ........ *H01L 29/42384* (2013.01); *H01L 27/088* (2013.01); *H01L 27/1207* (2013.01);
(Continued)

(58) Field of Classification Search
CPC ................. H01L 2924/00; H01L 29/66545; H01L 21/84; H01L 27/1203
USPC ........... 257/382, E21.577, E23.142; 438/586, 438/197, 585, 595, 596
See application file for complete search history.

(56) References Cited

U.S. PATENT DOCUMENTS

| | | |
|---|---|---|
| 4,966,870 A | 10/1990 | Barber et al. |
| 6,133,105 A | 10/2000 | Chen et al. |

(Continued)

OTHER PUBLICATIONS

Non-Final Rejection dated Feb. 14, 2013 for U.S. Appl. No. 13/617,866.

(Continued)

*Primary Examiner* — Mary Wilczewski
*Assistant Examiner* — Tsz Chiu
(74) *Attorney, Agent, or Firm* — David A. Cain, Esq.

(57) ABSTRACT

A method is provided for fabricating an integrated circuit that includes multiple transistors. A replacement gate stack is formed on a semiconductor layer, a gate spacer is formed, and a dielectric layer is formed. The dummy gate stack is removed to form a cavity. A gate dielectric and a work function metal layer are formed in the cavity. The cavity is filled with a gate conductor. One and only one of the gate conductor and the work function metal layer are selectively recessed. An oxide film is formed in the recess such that its upper surface is co-planar with the upper surface of the dielectric layer. The oxide film is used to selectively grow an oxide cap. An interlayer dielectric is formed and etched to form a cavity for a source/drain contact. A source/drain contact is formed in the contact cavity, with a portion of the source/drain contact being located directly on the oxide cap.

6 Claims, 9 Drawing Sheets

(51) Int. Cl.
*H01L 29/423* (2006.01)
*H01L 29/49* (2006.01)
*H01L 29/66* (2006.01)
*H01L 29/786* (2006.01)
*H01L 27/12* (2006.01)
*H01L 27/088* (2006.01)
*H01L 29/78* (2006.01)

(52) U.S. Cl.
CPC ...... *H01L29/4908* (2013.01); *H01L 29/66545* (2013.01); *H01L 29/78* (2013.01); *H01L 29/78651* (2013.01); *H01L 29/78654* (2013.01)

(56) References Cited

U.S. PATENT DOCUMENTS

| | | | |
|---|---|---|---|
| 6,204,185 B1 | 3/2001 | Hsu | |
| 6,323,118 B1 | 11/2001 | Shih et al. | |
| 6,448,140 B1 | 9/2002 | Liaw | |
| 6,465,334 B1 | 10/2002 | Buynoski et al. | 438/591 |
| 6,607,950 B2* | 8/2003 | Henson | H01L 21/28114 257/E21.205 |
| 6,812,514 B1* | 11/2004 | Yang | H01L 21/28273 257/314 |
| 7,294,890 B2* | 11/2007 | Lo | H01L 29/458 257/384 |
| 7,659,171 B2 | 2/2010 | Furukawa et al. | |
| 7,842,977 B2 | 11/2010 | Jakschik et al. | 257/213 |
| 7,906,390 B2* | 3/2011 | Mandelman | H01L 29/4958 257/377 |
| 8,232,607 B2 | 7/2012 | Edge et al. | 257/382 |
| 8,383,473 B1 | 2/2013 | Triyoso et al. | 438/197 |
| 8,426,300 B2 | 4/2013 | Ramachandran et al. | 438/586 |
| 8,440,533 B2 | 5/2013 | Toh et al. | 438/299 |
| 8,623,730 B2* | 1/2014 | Fan | H01L 29/42384 438/211 |
| 2001/0035558 A1* | 11/2001 | Smith et al. | H01L 21/76895 257/408 |
| 2002/0192911 A1* | 12/2002 | Parke | H01L 29/78648 438/270 |
| 2005/0055494 A1* | 3/2005 | Doris | H01L 21/28079 711/103 |
| 2006/0199321 A1* | 9/2006 | Lo | H01L 29/458 438/197 |
| 2006/0228842 A1* | 10/2006 | Zhang | H01L 29/7848 438/184 |
| 2007/0099407 A1* | 5/2007 | Lu | H01L 21/28097 438/592 |
| 2008/0128763 A1* | 6/2008 | Rachmady | H01L 21/76897 257/288 |
| 2008/0173947 A1 | 7/2008 | Hou et al. | |
| 2008/0265322 A1 | 10/2008 | Lin et al. | 257/347 |
| 2009/0206413 A1* | 8/2009 | Cabral, Jr. | H01L 21/28052 257/369 |
| 2009/0206416 A1* | 8/2009 | Cheng | H01L 21/823842 257/369 |
| 2009/0289334 A1* | 11/2009 | Rachmady | H01L 21/28079 257/649 |
| 2011/0081774 A1* | 4/2011 | Yeh | H01L 21/823835 438/591 |
| 2011/0151635 A1* | 6/2011 | Liu | H01L 21/28518 438/301 |
| 2011/0156107 A1* | 6/2011 | Bohr | H01L 21/76831 257/288 |
| 2012/0126295 A1* | 5/2012 | Edge | H01L 21/823807 257/288 |
| 2012/0280288 A1* | 11/2012 | Ando | H01L 21/28176 257/288 |

OTHER PUBLICATIONS

IBM, "Trench Silicide Contacts," ip.com, IPCOM000184829D, Jul. 1, 2009.
Kusters, K.H., et al., "A Self Aligned Contact Process with Improved Surface Planarization," J. Phys. Colloques, vo. 49, No. c4, 1988.
Non-Final Rejection dated Jan. 7, 2013 for U.S. Appl. No. 13/345,201.

* cited by examiner

SILICON-ON-INSULATOR TRANSISTOR WITH SELF-ALIGNED BORDERLESS SOURCE/DRAIN CONTACTS

CROSS-REFERENCE TO RELATED APPLICATIONS

This application is a continuation of prior U.S. application Ser. No. 13/617,866, filed Sep. 14, 2012 (now issued as U.S. Pat. No. 8,623,730), which is a continuation of prior U.S. application Ser. No. 13/345,201, filed Jan. 6, 2012. The entire disclosures of U.S. application Ser. No. 13/617,866 and U.S. application Ser. No. 13/345,201 are herein incorporated by reference.

FIELD OF THE INVENTION

The present invention generally relates to the field of semiconductor devices, and more particularly relates to silicon-on-insulator (SOI) transistors with self-aligned borderless source/drain contacts.

BACKGROUND OF THE INVENTION

As semiconductor devices move to ever smaller dimensions, the space for source/drain contacts is reduced even more than the reduction in scale of the transistor. For example, in the 20 nm generation, the lithographic contact dimension is about 65 nm, and this must be reduced to about 20 nm in the etch. With such drastic reductions, the source/drain contact cannot be guarantee to land on the silicided area of the source/drain. The source/drain contact will frequently impinge on the area between the side of the gate stack and the edge of the silicided area of the source/drain. This critical area must be protected in order to prevent modification of the critical dopant concentration required for advanced junction designs. Further, if a portion of the source/drain contact lands on the gate, the transistor will be shorted. Such source/drain contacts that land on the gate must be prevented from shorting the device or punching through the silicon beneath the gate spacer.

SUMMARY OF THE INVENTION

One embodiment of the present invention provides a method for fabricating a transistor. According to the method, a replacement gate stack is formed on a semiconductor layer, a gate spacer is formed on sidewalls of the replacement gate stack, and a dielectric layer is formed on the semiconductor layer and abutting the gate spacer. After forming the gate spacer and the dielectric layer, the dummy gate stack is removed to form a cavity. A gate dielectric is formed in the cavity, and a work function metal layer is formed in the cavity. After forming the gate dielectric and the work function metal layer, a remaining portion of the cavity is filled with a gate conductor. One and only one of the gate conductor and the work function metal layer are selectively recessed to form a recess. An oxide film is formed in the recess such that its upper surface is co-planar with the upper surface of the dielectric layer. The oxide film is used to selectively grow an oxide cap directly on the upper surface of the gate dielectric, the upper surface of the oxide film, and a portion of the upper surface of the dielectric layer. An interlayer dielectric is formed, and the interlayer dielectric and the dielectric layer are etched to form at least one contact cavity for a source/drain contact. A source/drain contact is formed in the contact cavity, with a portion of the source/drain contact being located directly on the oxide cap.

Another embodiment of the present invention provides a transistor that includes a semiconductor layer, a gate spacer located on the semiconductor layer, a gate dielectric located above the semiconductor layer, a work function metal layer located on the gate dielectric and vertical sidewalls of the gate dielectric, and a gate conductor located on the work function metal layer. The transistor also includes a dielectric layer located on the semiconductor layer and abutting the gate spacer, an oxide film, and an oxide cap. The oxide film is located above one and only one of the work function metal layer and the gate conductor. The upper surface of the dielectric layer is co-planar with the upper surface of the oxide film and the upper surface of the second portion of the gate dielectric, and the oxide cap is located directly on the upper surface of the gate dielectric, the upper surface of the oxide film, and a portion of the upper surface of the dielectric layer. The transistor further includes source/drain regions located in the semiconductor layer, and a source/drain contact passing through the dielectric layer and contacting an upper surface of one of the source/drain regions. A portion of the source/drain contact being located directly on the oxide cap.

Other objects, features, and advantages of the present invention will become apparent from the following detailed description. It should be understood, however, that the detailed description and specific examples, while indicating various embodiments of the present invention, are given by way of illustration only and various modifications may naturally be performed without deviating from the present invention.

DETAILED DESCRIPTION

Borderless source/drain contacts are now being used to prevent source/drain contacts that land on the gate from shorting the transistor. A borderless source/drain contact requires no border between the gate and the contact. The gate stack is encapsulated in dielectric so that the borderless source/drain contact can land on the gate without shorting the device. In gate-first transistor fabrication processes, the gate stack can just be encapsulated during gate formation. In particular, after depositing the gate layers, a dielectric layer is deposited over the structure. Then when the gate stack is etched to pattern the gate, this overlying dielectric layer is also etched at the same time to protect the top of the gate stack. Dielectric spacers are then formed on the sides of the gate stack to produce a gate stack that is encapsulated and thus protected from being shorted by source/drain contacts that land on the gate.

However, in gate-last transistor fabrication processes, such an encapsulation method cannot be used to encapsulate the gate stack. A dummy gate is formed in gate-last transistor fabrication processes. This dummy gate is later removed to open a cavity from the top, and then the actual gate is formed in this cavity. Because the dummy gate and everything above it is removed when opening the cavity, the gate-first encapsulation method cannot be used to encapsulate the gate stack in gate-last transistor fabrication processes. One method for encapsulating the gate in gate-last transistor fabrication processes is to recess both the work function metal and the gate conductor, and then fill this recess with a dielectric material. However, this requires a precise deep etch of both the work function metal and the gate conductor. Such a precise deep etch of both materials is difficult to obtain and can significantly lower the gate conductance.

Embodiments of the present invention provide a silicon-on-insulator (SOI) transistor with self-aligned borderless source/drain contacts. After formation of the gate stack, a shallow recess is made in one of the metal layers of the gate stack (e.g., the work function metal or the gate conductor). A dielectric film is formed in the recess and then used as a seed to selectively grow a dielectric cap over the gate stack. The dielectric cap protects the gate stack during the etching of the source/drain contacts. This borderless contact integration scheme can be used in gate-last fabrication processes that utilize a replacement metal gate structure and in gate-first fabrication processes that utilize a full metal gate.

Figure 1:
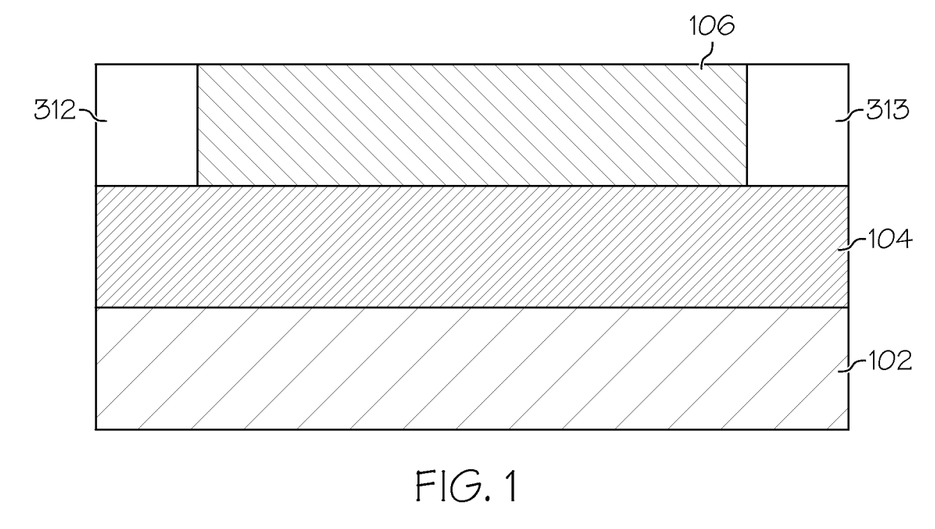
FIG. 1 shows a cross-sectional view of a substrate, buried insulator layer, and a semiconductor layer according to a first embodiment of the present invention.

FIGS. 1 to 8 illustrate a process for forming an SOI transistor having self-aligned borderless source/drain contacts according to a first embodiment of the present invention. As shown in FIG. 1, there is provided an SOI wafer having a silicon substrate 102, a buried insulator layer (BOX) 104, and a semiconductor layer 106.

The substrate 102 of this embodiment is a semiconductor substrate comprising a single crystalline semiconductor material such as single crystalline silicon, a polycrystalline semiconductor material, an amorphous semiconductor material, or a stack thereof. The thickness of the substrate 102 is from 50 microns to 1,000 microns, although lesser and greater thicknesses are employed in further embodiments. The BOX layer 104 includes a dielectric material such as silicon oxide, silicon nitride, silicon oxynitride, or a combination thereof. The thickness of the BOX layer 104 is from 50 nm to 500 nm, although lesser and greater thicknesses are employed in further embodiments.

The semiconductor layer 106 is any semiconducting material such as Si (silicon), strained Si, SiC (silicon carbide), SiGe (silicon germanium), SiGeC (silicon-germanium-carbon), Si alloys, Ge, Ge alloys, GaAs (gallium arsenide), InAs (indium arsenide), InP (indium phosphide), or any combination thereof. The thickness of the semiconductor layer 106 is from 3 nm to 60 nm, and typically from 5 nm to 10 nm, although lesser and greater thicknesses are employed in further embodiments.

The semiconductor layer 106 can be undoped or doped with either p-type or n-type dopants through ion implantation, plasma doping, or gas phase doping. P-type transistors are produced by doping the semiconductor layer 106 with elements from group III of the periodic table (e.g., boron, aluminum, gallium, or indium). As an example, the dopant can be boron in a concentration ranging from $1 \times 10E18$ atoms/cm3 to $2 \times 10E21$ atoms/cm3. N-type transistors are produced by doping the semiconductor layer 106 with elements from group V of the periodic table (e.g., phosphorus, antimony, or arsenic). In this example, the BOX layer 104 is composed of silicon oxide and the semiconductor layer 106 is composed of silicon and doped with a first conductivity type dopant.

Next, an active area for the transistor is isolated by shallow trench isolation (STI). In this embodiment, shallow trench isolation (STI) structures 312 and 313 are formed by making trenches extending from the top surface of the semiconductor layer 106 to the BOX layer 104, filling the trenches with a dielectric material, and removing excess dielectric material from above the top surface of the semiconductor layer 106. This forms an STI region 312 and 313 above the BOX layer 104 that is continuous around the active area.

Figure 2:
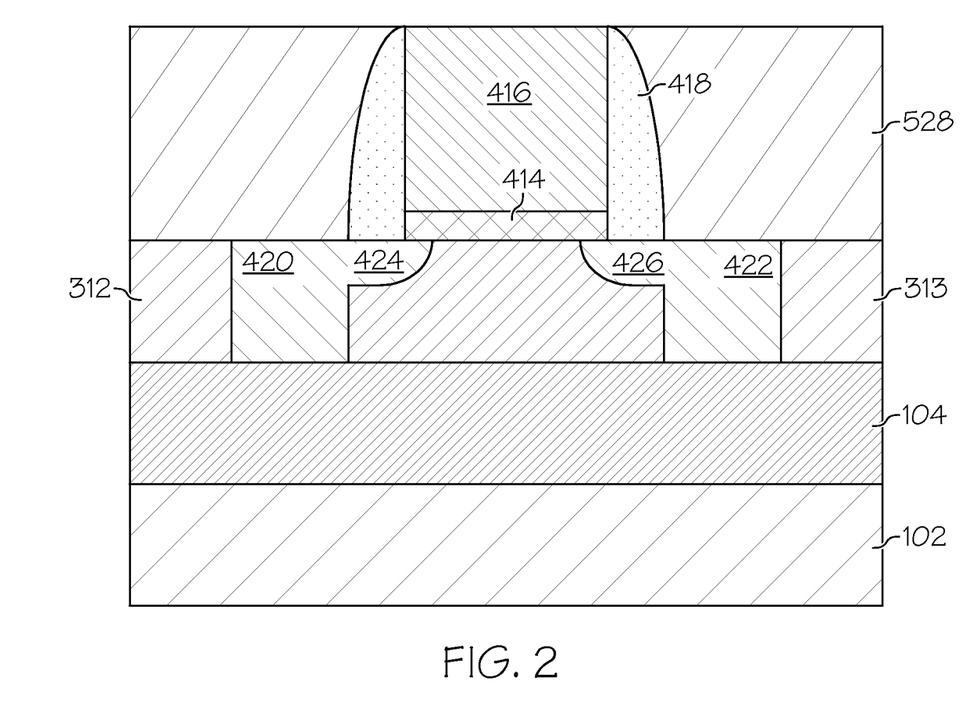
FIG. 2 shows a cross-sectional view of the structure after a replacement gate structure has been formed according to the first embodiment of the present invention.

As shown in FIG. 2, a replacement (or dummy) gate stack structure is formed to act as a place holder for the actual gate stack that is formed later. The replacement gate stack structure of this embodiment includes a replacement gate dielectric 414 and a replacement gate material 416 that are formed on the active area of the silicon layer 106. The replacement gate dielectric 414 is a dielectric material that can function as an etch stop layer during subsequent removal of the replacement gate material 416. In this embodiment, the replacement gate dielectric 414 is silicon oxide, silicon nitride, silicon oxynitride, or a combination thereof.

The replacement gate material 416 is a dielectric or conducting material that can be removed selectively with respect to the replacement gate dielectric 414 and a gate spacer 418. In this embodiment, the replacement gate material 416 is a dielectric material (e.g., silicon oxide, silicon nitride, silicon oxynitride, or a combination thereof). The thickness of the replacement gate stack structure 414 and 416 is from 10 nm to 500 nm, although lesser and greater thicknesses are employed in further embodiments.

The gate spacer 418 is a dielectric material (such as silicon oxide, silicon nitride, silicon oxynitride, or a combination of these) formed on the sidewalls of the replacement gate stack 414 and 416. In this embodiment, the gate spacer 418 is formed by deposition of a conformal dielectric material layer and then etching to remove the dielectric material except from the sidewalls of the dummy gate stack 414 and 416. The thickness of the gate spacer 418 at the base that contacts the semiconductor layer 106 is from 10 nm to 120 nm, and typically from 20 nm to 60 nm, although lesser and greater thicknesses are employed in further embodiments.

In the illustrated embodiment, source and drain extension regions 424 and 426 are formed by introducing dopants into exposed portions of the semiconductor layer 106, employing the replacement gate stack structure 414 and 416 as a mask. The source and drain extension regions 424 and 426 have doping of a second conductivity type, which is the opposite of the first conductivity type. In this embodiment, source and drain regions 420 and 422 are formed by deep implanting dopants into exposed portions of the semiconductor layer 106, employing the combination of the replacement gate stack structure 414 and 416 and the gate spacer 418 as a mask.

The source and drain regions 420 and 422 have the same type of doping as the source and drain extension regions 424 and 426. A thermal anneal can be performed to activate and diffuse the implanted ions.

In this embodiment, for an NFET, the source/drain regions 420 and 422 are heavily doped with an n-type dopant and the source/drain extension regions 424 and 426 are lightly doped with the same or a different n-type dopant. Conversely, for a PFET, the source/drain regions 420 and 422 are heavily doped with a p-type dopant and the source/drain extension regions 424 and 426 are lightly doped with the same or a different p-type dopant. Silicided areas for contacts are then formed on the source and drain regions.

After the source/drain regions 420 and 422 have been formed, a dielectric layer 528 is formed over the entire structure. In this embodiment, the dielectric layer 528 is a dielectric material such as silicon oxide, silicon nitride, silicon oxynitride, or a combination thereof that is formed through chemical vapor deposition (CVD). This dielectric layer 528 is etched down to the level of the top surface of the replacement gate stack 414 and 416.

Figure 3:
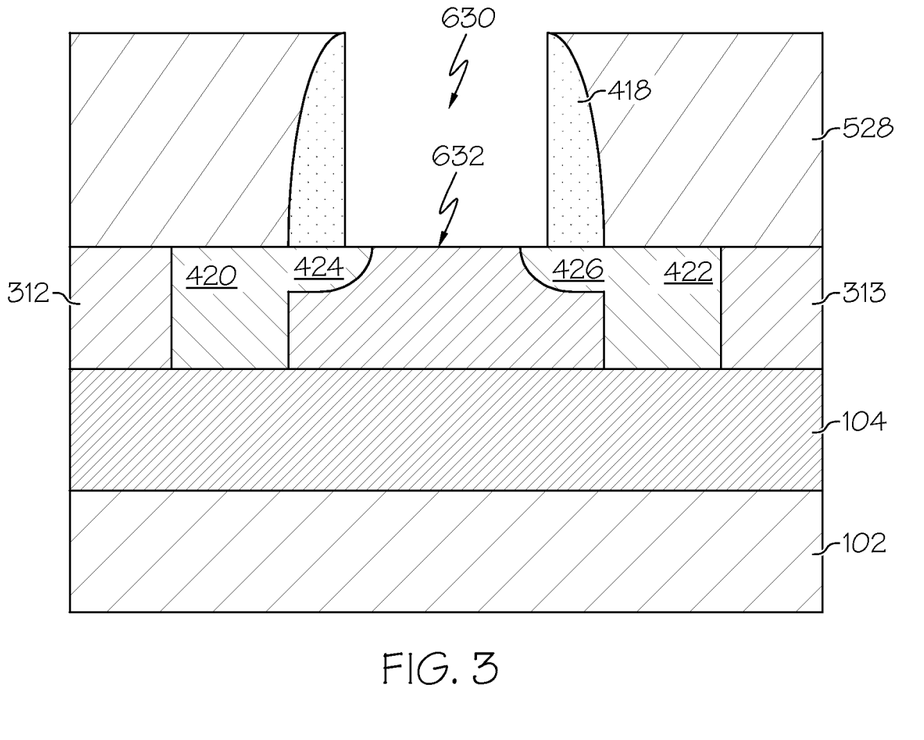
FIG. 3 shows a cross-sectional view of the structure after the replacement gate structure has been removed to form a gate cavity according to the first embodiment of the present invention.

As shown in FIG. 3, the replacement gate stack 414 and 416 is then selectively removed with respect to the gate spacer 418 (e.g., via selective etching). This forms a gate cavity 630 that is laterally surrounded by the gate spacer 418. The inner sidewalls of the gate spacer 418 and a portion of the top surface of the semiconductor layer 106 are exposed by formation of the gate cavity 630.

Optionally, an interfacial layer is formed on the exposed surface of the semiconductor layer 106 by conversion of a surface portion of the semiconductor material into a dielectric material. For example, the semiconductor layer 106 can be single crystalline silicon, and the interfacial layer can be silicon oxide which is formed by thermal oxidation, chemical oxidation, or plasma oxidation of the surface portion. The thickness of the interfacial layer is from 0.1 nm to 1.5 nm, although lesser and greater thicknesses are employed in further embodiments. The thickness, however, may be different after processing at higher temperatures, which are usually required during device fabrication.

Figure 4:
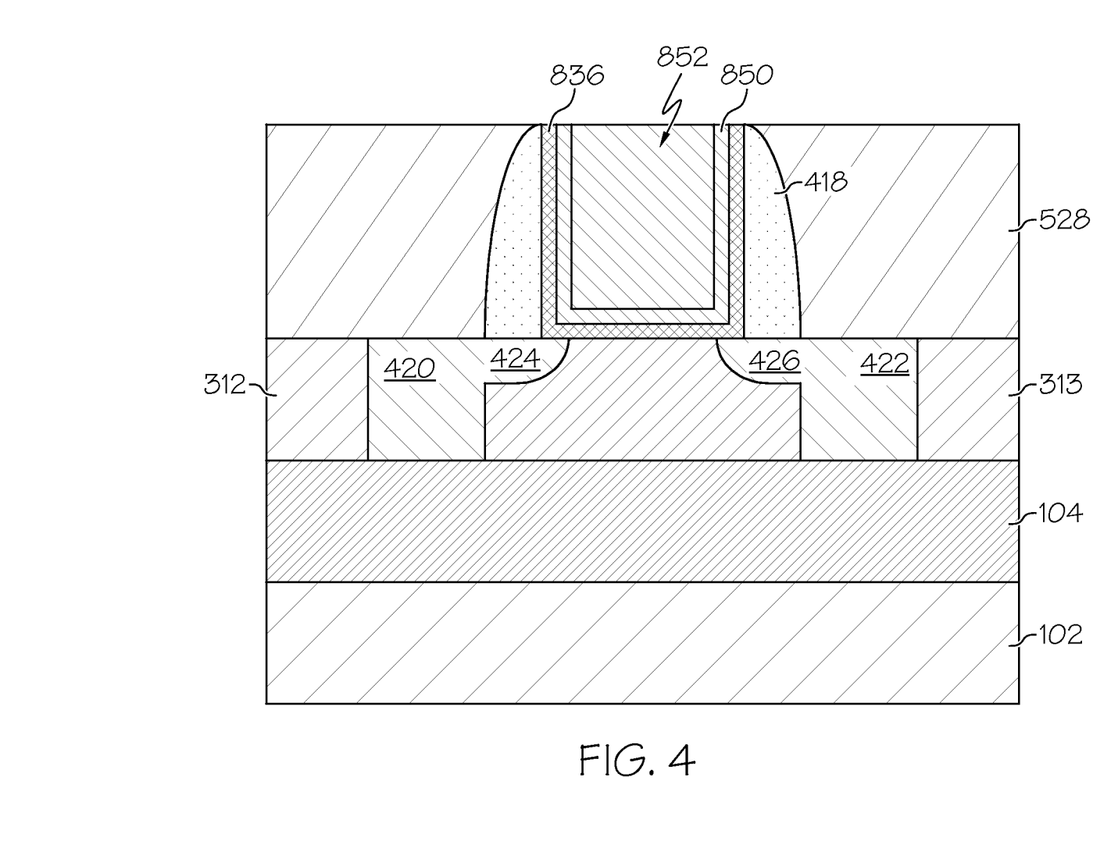
FIG. 4 shows a cross-sectional view of the structure after a dielectric layer and a gate conductor have been formed within the gate cavity according to the first embodiment of the present invention.

A high-k dielectric layer is then blanket deposited to form a high-k gate dielectric layer 836 on the bottom and vertical sidewalls of the gate cavity, as shown in FIG. 4. The high-k dielectric layer 836 is a dielectric metal oxide having a dielectric constant greater than 8.0. The dielectric metal oxide is deposited by a process such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. In this embodiment, the high-k gate dielectric layer 836 comprises $HfO_2$ or $ZrO_2$. However, other materials such as $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y2O_xN_y$, a silicate thereof, and an alloy thereof are applicable as well (each value of x is independently from 0.5 to 3 and each value of y is independently from 0 to 2). The thickness of the high-k gate dielectric layer 836 is from 0.5 nm to 6 nm, and typically from 1.0 nm to 3 nm, although lesser and greater thicknesses are employed in further embodiments.

After the high-k gate dielectric 836 has been formed, a work function metal layer 850 is deposited on the gate dielectric layer 836. This work function metal layer 850 is formed by chemical vapor deposition (CVD), atomic layer deposition (ALD), molecular beam epitaxy (MBE), pulsed laser deposition (PLD), liquid source misted chemical deposition (LSMCD), physical vapor deposition (PVD), or a combination thereof. The work function metal layer 850 optimizes the performance of the transistor by tuning the work function of the gate electrode. In this embodiment, this work function metal layer 850 is a p-type work function material, such as TiN. Other metallic materials such as Pt, Rh, Ir, Ru, Cu, Os, Be, Co, Pd, Te, Cr, Ni, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, alloys thereof, conductive oxides thereof, conductive nitrides thereof, and any combinations of the foregoing can also be used.

Next, a gate conductor material 56 is deposited in the gate cavity. The gate conductor material 852 comprises a conductive material, which can be a doped semiconductor material, a metallic material, or a combination thereof. The doped semiconductor material can be doped polysilicon, doped polycrystalline germanium, a doped silicon-germanium alloy, any other doped elemental, a compound semiconductor material, or a combination thereof. The metallic material can be any metallic material that can be deposited by chemical vapor deposition (CVD), physical vapor deposition (PVD), or a combination thereof, such as aluminum, tungsten, ruthenium, or a conductive refractory metal nitride, such as TaN (tantalum nitride), TiN (titanium nitride), WN (tungsten nitride), TiAl (titanium aluminum), TiAlN (titanium aluminum nitride), TaCN (triazacyclononane), or an alloy thereof. In the illustrated embodiment, the gate conductor material 852 can be aluminum, tungsten, ruthenium, or any conductive metal or metal alloy (such as aluminum-cobalt). The thickness of the gate conductor material 852 is selected to completely fill the gate cavity.

The portions of the high-k gate dielectric layer, work function metal layer, and gate conductor material above the top surface of the dielectric layer 528 are removed by planarization, which can be performed by chemical mechanical planarization (CMP), recess etch, or a combination thereof. The remaining portion of the high-k gate dielectric layer constitutes a U-shaped gate dielectric 836, the remaining portion of the work function metal layer constitutes a U-shaped work function metal layer 850, and the remaining portion of the gate conductive material layer 56 constitutes a gate conductor 852.

The top surface of the U-shaped gate dielectric 836, the top surface of the U-shaped work function metal layer 850, and the top surface of the gate conductor 852 are coplanar with the top surface of the dielectric layer 528 after planarization, as shown in FIG. 4. The U-shaped gate dielectric 836, the U-shaped work function metal layer 850, and the gate conductor 852 collectively constitute the gate stack of the transistor. The gate spacer 418 laterally surrounds the gate stack and has a top surface that is coplanar with the top surface of the dielectric layer 528.

Figure 5:
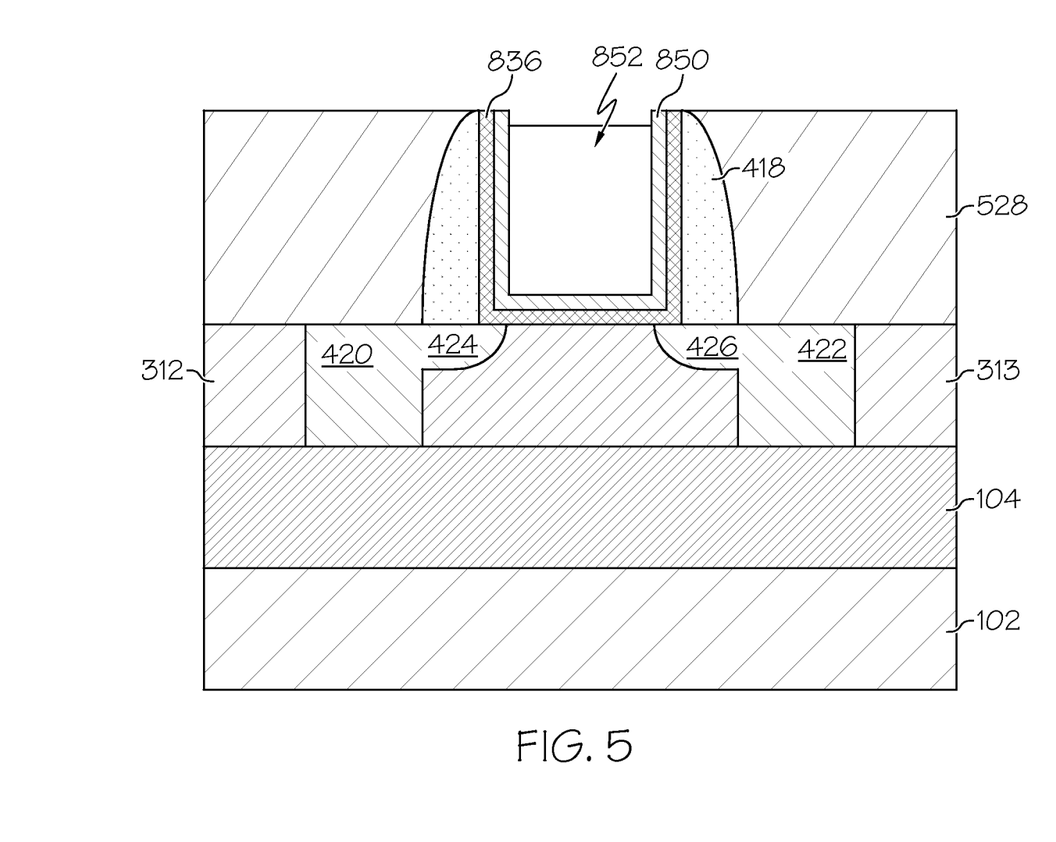
FIG. 5 shows a cross-sectional view of the structure after the gate conductor is recessed according to the first embodiment of the present invention.

After completing the gate stack, the gate conductor 852 is selectively recessed, as shown in FIG. 5. In this embodiment, this selective recess is preformed through a dry etch (for example, using $Cl_2$-based, $BCl_3$-based, or $CH_3F$-based chemistry). The depth of this recess does not have to be well controlled and the recess can be very shallow (e.g., 2-8 nm). The recess just has to be deep enough that at least part of the subsequently deposited layer survives the planarization step following its formation. While a deeper recess can also be used, it should not be so deep as to affect the gate conductance. A shallow recess performs the necessary function while maintaining a high gate conductance. Further, the recesses do not have to be uniform in the gates of all transistors of an integrated circuit. In the illustrated embodiment, the recess has an exemplary depth of 5-10 nm.

Figure 6:
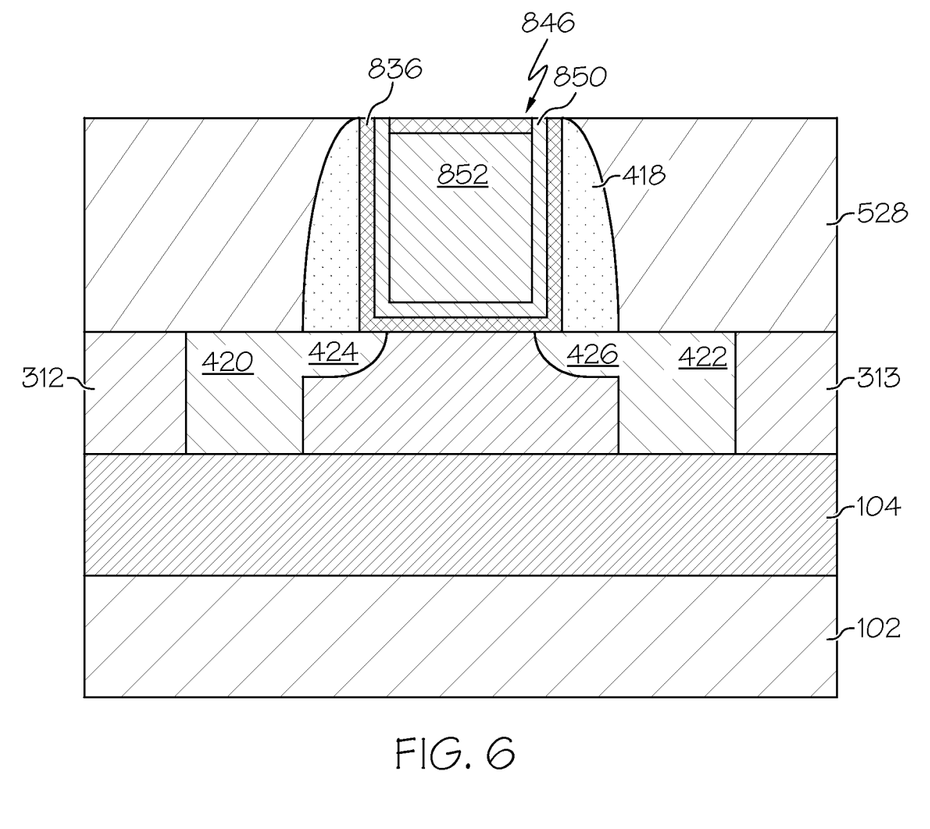
FIG. 6 shows a cross-sectional view of the structure after a silicon dioxide film is formed in the recess according to the first embodiment of the present invention.

Next, a silicon dioxide film 846 is formed in the recess that was made in the gate conductor 852, as shown in FIG. 6. In this embodiment, a damascene process is used to inlay the silicon dioxide film 846 in the recess. More specifically, silicon dioxide is deposited over the entire device so as to overfill the recess, and then CMP is performed to remove the silicon dioxide down to the level of the top of the dielectric layer 528. The silicon dioxide film 846 that is within the recess is not removed.

Figure 7:
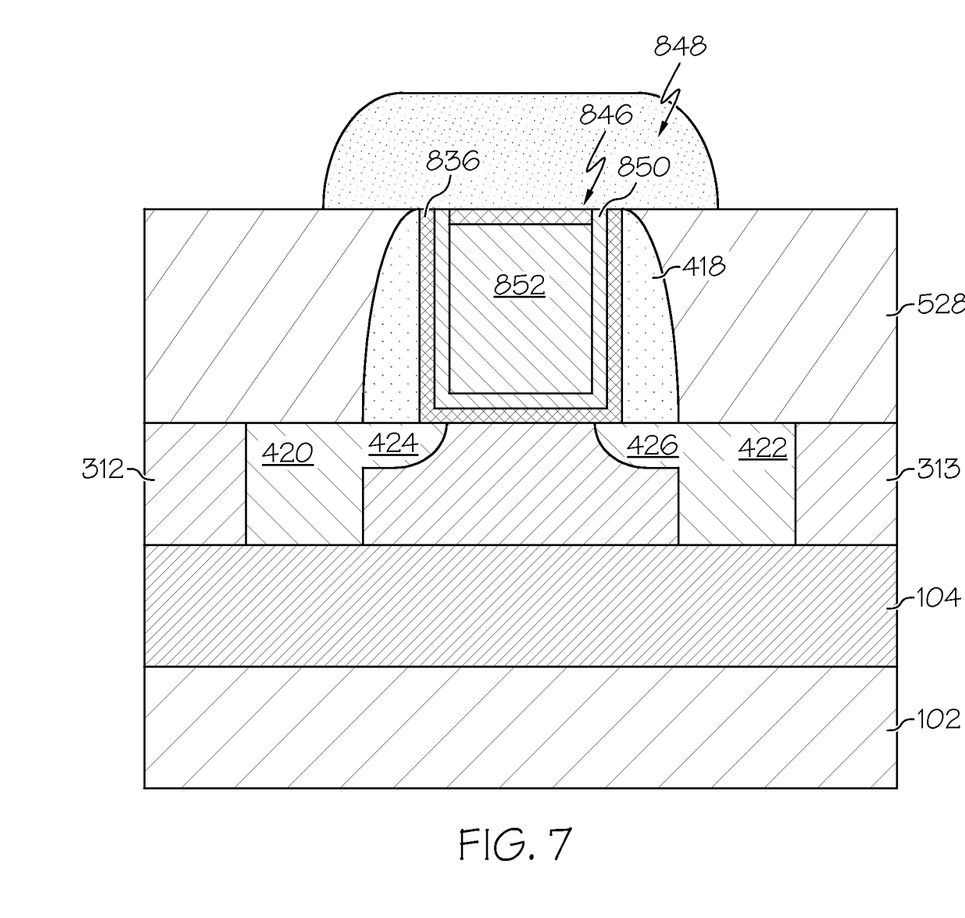
FIG. 7 shows a cross-sectional view of the structure after a silicon dioxide cap is grown on top of the silicon dioxide film according to the first embodiment of the present invention.

A silicon dioxide cap 848 is then selectively grown on top of the damascened silicon dioxide film 846, as shown in FIG. 7. The silicon dioxide cap 848 is wider than the gate stack, and preferably its width extends beyond the outer edges of the gate spacer 418 (i.e., the lateral extent of the cap is greater than the lateral extent of the gate spacer). Thus, the combination of the silicon dioxide cap and the gate spacer encapsulates the gate stack. In this embodiment, the silicon dioxide cap 848 is grown by molecular layer dielectric chemical vapor deposition (MLD CVD). Thus, the silicon oxide film 846 in the recess in the gate conductor 852 acts as a seed to grow the silicon dioxide cap 848 above the gate stack. The silicon dioxide cap 848 is self-aligned, with no patterning or other processing required. Further, the silicon dioxide cap 848 grows only above the gate stack where it is needed.

Figure 8:
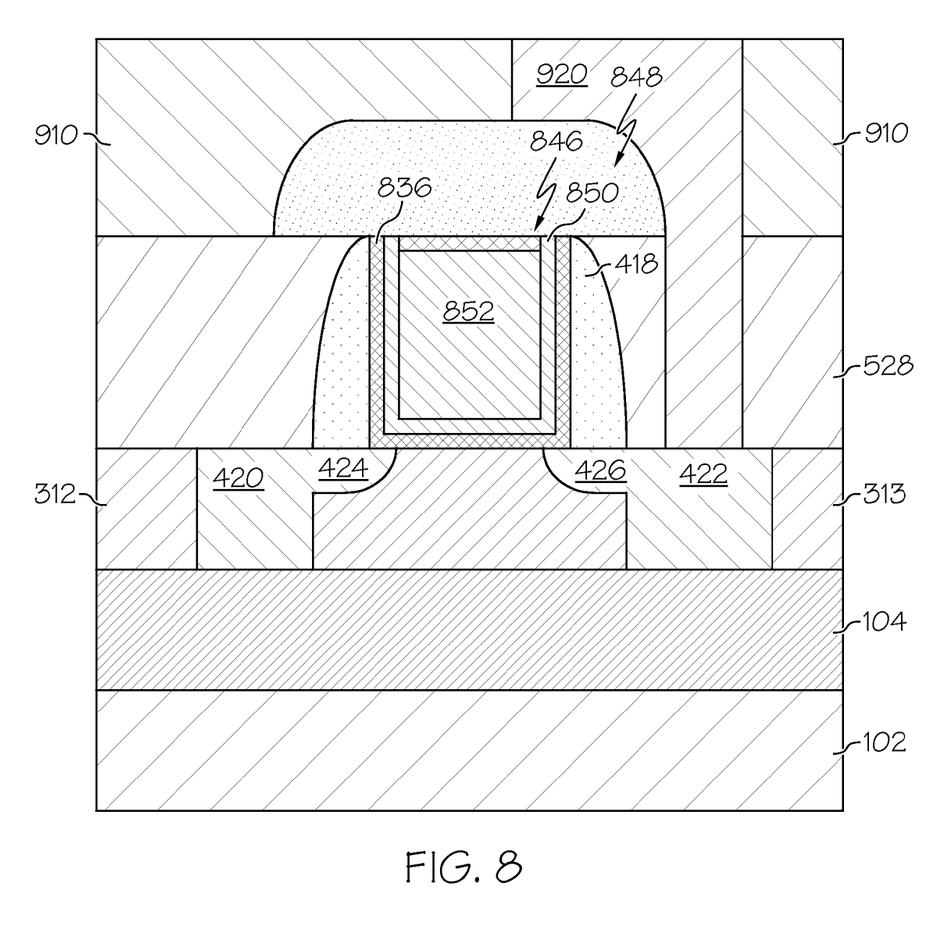
FIG. 8 shows a cross-sectional view of the structure after formation of source/drain contacts according to the first embodiment of the present invention.

Next, an interlayer dielectric 910 is deposited over the structure, as shown in FIG. 8. In this embodiment, the interlayer dielectric 910 is a nitride layer. A photolithography mask for the source/drain contacts is then deposited and patterned. An etch is then performed to form cavities for the source/drain contacts. This etch forms contact cavities through the interlayer dielectric 910 and dielectric layer 528, stopping on the semiconductor layer 106 (at least partially on the silicided area of the source/drain region). In this embodiment, a reactive ion etch (RIE) is used to form the contact cavities.

Due to the selectivity between silicon dioxide and nitride, the silicon dioxide cap 848 is not removed during etching of the nitride interlayer dielectric 910. The silicon dioxide cap 848 on top of the gate stack serves as an etch stop layer during the etching for the contacts, guiding the source/drain contact away from the gate stack. Thus, the source/drain contact is borderless with respect to the gate stack. The contact cavities are then filled with a conducting material to form the source/drain contacts 920. In this embodiment, the source/drain contacts are formed by a metal such as copper, tungsten, aluminum, ruthenium, or TiN. Conventional fabrication steps are then performed to form the remainder of the integrated circuit that includes this transistor.

FIGS. 9 to 12 illustrate a process for forming an SOI transistor having self-aligned borderless source/drain contacts according to a second embodiment of the present invention. In this embodiment, the work function metal layer is selectively recessed.

Figure 9:
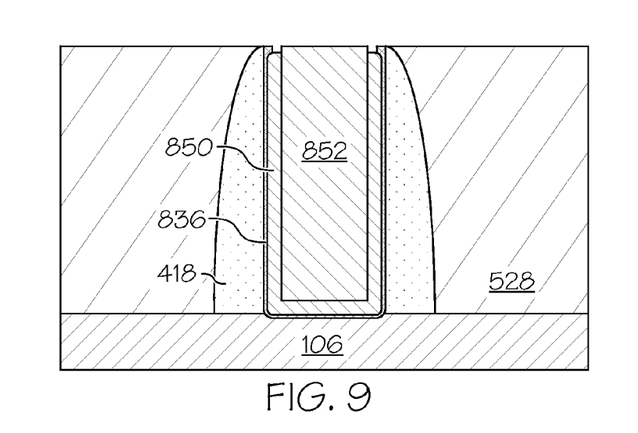
FIGS. 9 to 12 illustrate a process for forming an SOI transistor having self-aligned borderless source/drain contacts according to a second embodiment of the present invention.

The gate stack is first formed in the manner described above with reference to FIGS. 1-4. After completing the gate stack, the work function metal layer 850 is selectively recessed, as shown in FIG. 9. In this embodiment, this selective recess is preformed through a dry etch (for example, using $Cl_2$-based, $BCl_3$-based, or $CH_2F$-based chemistry). The depth of this recess does not have to be well controlled and the recess can be very shallow (e.g., 2-4 nm). In the illustrated embodiment, the recess has an exemplary depth of 5-10 nm.

Figure 10:
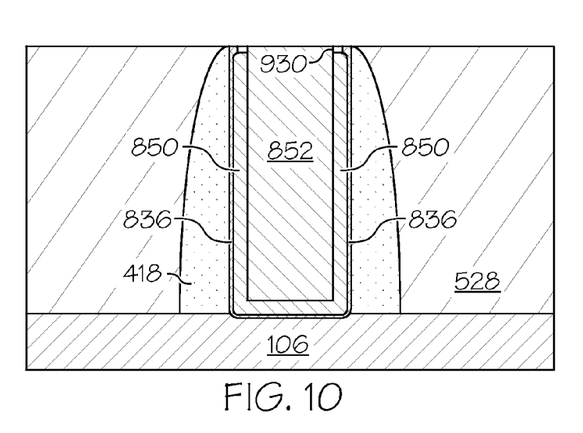
Figure 11:
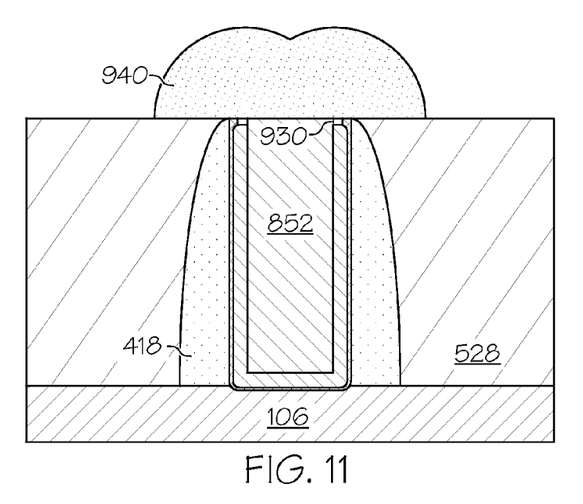

Next, a silicon dioxide film 930 is formed in the recess that was made in the work function metal layer 850, as shown in FIG. 10. In this embodiment, a damascene process is used to inlay the silicon dioxide film 930 in the recess. A silicon dioxide cap 940 is then selectively grown on top of the damascened silicon dioxide film 930, as shown in FIG. 11. The silicon dioxide cap 940 is grown so as to cover the entire gate stack and be wider than the gate stack, preferably extending beyond the outer edges of the gate spacer 418. This growth is seeded at the edges of the gate and the growing cap joins in the center of the gate stack, as shown in the cross-section of FIG. 11. In this embodiment, the silicon dioxide cap 940 is grown by MLD CVD Thus, the silicon oxide film 930 in the recess in the work function metal layer 850 acts as a seed to grow the silicon dioxide cap 940 above the gate stack. The silicon dioxide cap is self-aligned and grows only where it is needed.

Figure 12:
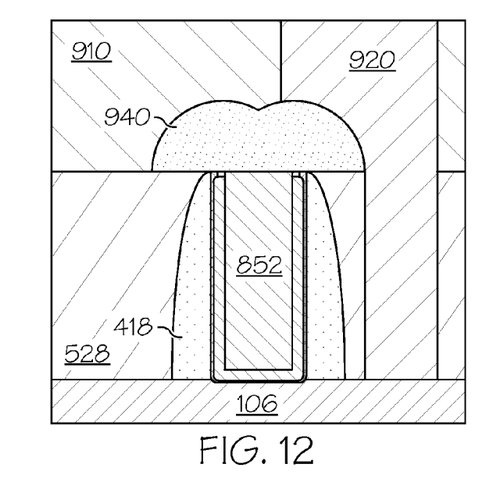

Next, an interlayer dielectric 910 is deposited over the structure, as shown in FIG. 12. In this embodiment, the interlayer dielectric 910 is a nitride layer. A photolithography mask for the source/drain contacts is then deposited and patterned. An etch is then performed to form cavities for the source/drain contacts. This etch forms contact cavities through the interlayer dielectric 910 and dielectric layer 528, stopping on the semiconductor layer 106 (at least partially on the silicided area of the source/drain region). In this embodiment, a reactive ion etch (RIE) is used to form the contact cavities.

The silicon dioxide cap 940 on top of the gate stack serves as an etch stop layer during the etching for the contacts, guiding the source/drain contact away from the gate stack. Thus, the source/drain contact is borderless with respect to the gate stack. The contact cavities are then filled with a conducting material to form the source/drain contacts 920. In this embodiment, the source/drain contacts are formed by a metal, such as W, Cu, Al, or TiN. Conventional fabrication steps are then performed to form the remainder of the integrated circuit that includes this transistor.

The present invention is also applicable to gate-first fabrication with a full metal gate. In one embodiment, the final metal gate is capped with a nitride layer. By judiciously choosing materials, this nitride film can be selectively recessed with respect to the surrounding nitride interlayer dielectric. For example, the nitride cap material can be hydrogenated nitride film that has high wet etch rates, while the nitride interlayer dielectric can be IRAD nitride or PECVD nitride with a very low wet etch rate. The recess then can be formed through a wet etch in dilute HF. After the recess is formed, processing continues in the manner described above.

Accordingly, the present invention provides an SOI transistor with self-aligned borderless source/drain contacts. After formation of the gate stack, a shallow recess is made in one of the metal layers of the gate stack (e.g., the work function metal or the gate conductor). The recess is formed in less than all of the top-exposed layers of the gate stack, and preferably is formed in only one of the top-exposed layers of the gate stack. A dielectric film is formed in the recess and then used as a seed to selectively grow a dielectric cap over the gate stack. The dielectric cap protects the gate stack during the etching of the source/drain contacts. This borderless contact integration scheme can be used in gate-last fabrication processes that utilize a replacement metal gate structure and in gate-first fabrication processes that utilize a full metal gate.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating an integrated circuit that includes a plurality of transistors, the method comprising:
   forming a replacement gate stack on a semiconductor layer;
   forming a gate spacer on sidewalls of the replacement gate stack;
   forming a dielectric layer on the semiconductor layer and abutting the gate spacer;
   after forming the gate spacer and the dielectric layer, removing the replacement gate stack, the removing forming a cavity;
   after removing the replacement gate stack, forming a gate dielectric in the cavity;
   forming a work function metal layer in the cavity;
   after forming the gate dielectric and the work function metal layer, filling a remaining portion of the cavity with a gate conductor;
   performing a planarization so that an upper surface of the gate dielectric, an upper surface of the work function metal layer, and an upper surface of the gate conductor are all coplanar with an upper surface of the dielectric layer,
   after performing the planarization, etching one and only one of the gate conductor and the work function metal layer, the etching forming a recess;
   after etching one and only one of the gate conductor and the work function metal layer, forming an oxide film in the recess, an upper surface of the oxide film being co-planar with the upper surface of the dielectric layer;
   using the oxide film to selectively grow an oxide cap directly on the upper surface of the gate dielectric, the upper surface of the oxide film, and a portion of the upper surface of the dielectric layer;
   forming an interlayer dielectric;
   etching the interlayer dielectric and the dielectric layer to form at least one cavity for a source/drain contact, the etching forming a contact cavity; and
   forming a source/drain contact in the contact cavity, a portion of the source/drain contact being located directly on the oxide cap.

2. The method of claim 1, wherein in the etching of one and only one of the gate conductor and the work function metal layer, the gate conductor is etched so as to form the recess in the gate conductor and not in the work function metal layer, the upper surface of the gate conductor being below the upper surface of the dielectric layer, and the upper surface of the work function metal layer being co-planar with the upper surface of the dielectric layer.

3. The method of claim 1, wherein in the etching of one and only one of the gate conductor and the work function metal layer, the work function metal layer is etched so as to form the recess in the work function metal layer and not in the gate conductor, the upper surface of the work function metal layer being below the upper surface of the dielectric layer, and the upper surface of the gate conductor being co-planar with the upper surface of the dielectric layer.

4. The method of claim 1, wherein a lateral extent of the oxide cap is greater than a lateral extent of the gate spacer.

5. The method of claim 1, wherein the using of the oxide film to selectively grow the oxide cap comprises growing the oxide cap by molecular layer dielectric chemical vapor deposition using the oxide film in the recess as a seed.

6. The method of claim 1, wherein after performing the planarization,

- the gate dielectric is U-shaped, comprising a horizontal portion located directly on the semiconductor layer and a vertical portion located on vertical sidewalls of the gate spacer, an upper surface of the gate spacer being co-planar with an upper surface of the vertical portion of the gate dielectric,
- the work function metal layer is U-shaped, comprising a horizontal portion located directly on the horizontal portion of the gate dielectric and a vertical portion located on vertical sidewalls of the vertical portion of the gate dielectric, and
- the gate conductor is located directly on the horizontal portion of the work function metal layer and abutting vertical sidewalls of the vertical portion of the work function metal layer.

* * * * *